(12) United States Patent
Palathol Mana Sivadasan et al.

(10) Patent No.: US 6,507,242 B1
(45) Date of Patent: Jan. 14, 2003

(54) GAIN SWITCHING SCHEME FOR AMPLIFIERS WITH DIGITAL AUTOMATIC GAIN CONTROL

(75) Inventors: Mohandas Palathol Mana Sivadasan, Bangalore (IN); Anil Agarwal, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 7 days.

(21) Appl. No.: 09/672,122

(22) Filed: Sep. 27, 2000

(51) Int. Cl.$^7$ .................................................. H03G 3/20
(52) U.S. Cl. ......................................... 330/86; 330/282
(58) Field of Search ............................. 330/11, 86, 254, 330/282

(56) References Cited

U.S. PATENT DOCUMENTS 3,539,936 A * 11/1970 McGhee ..................... 330/86 X
3,810,035 A *  5/1974 Gundry .................... 330/282 X
5,955,925 A     9/1999 Segawa et al. ............. 330/279

* cited by examiner

*Primary Examiner*—Steven J. Mottola
(74) *Attorney, Agent, or Firm*—Wagner Murabito & Hao LLP

(57) ABSTRACT

One embodiment of the present invention is an improved feedback amplifier circuit having a variable closed loop gain which avoids including switching elements in its feedback network and maintains a constant output voltage window for an input signal having a wide dynamic range. That is, the switching elements are not on the active feedback path (e.g., they are isolated from the active feedback path). In this manner, the gain of the amplifier circuit may be determined only by the feedback resistance which can be more easily controlled through the use of precision resistors. Additionally, by removing the switches from the feedback network, the parasitics associated with each switch may also be removed from the feedback path of the amplifier circuit. Accordingly, the bandwidth of the feedback amplifier circuit can be controlled more effectively. Specifically, the present embodiment avoids locating the switching functionality in the feedback network by changing the output stage of the feedback amplifier circuit. In other words, the switching functionality of the present embodiment is located within the output stage of the feedback amplifier circuit. Furthermore, it is appreciated that the present embodiment provides a way to isolate the unused feedback path of the feedback amplifier circuit which has a variable closed loop gain.

21 Claims, 2 Drawing Sheets

GAIN SWITCHING SCHEME FOR AMPLIFIERS WITH DIGITAL AUTOMATIC GAIN CONTROL

TECHNICAL FIELD

The present invention generally relates to the field of amplifier circuits. More particularly, the present invention relates to the field of feedback amplifier circuits.

BACKGROUND ART

Integrated circuit (IC) semiconductor chips are critical components found within virtually all modern electronic devices such as computers, satellites, communication systems, global positioning system (GPS) devices capable of determining the specific locations of their users on the surface of the earth, cellular phones which enable their users to communicate wirelessly with other people, different types of instrumentation, along with many consumer products, to name a few. It is appreciated that integrated circuit semiconductor chips are composed of many different types of electrical components and circuitry. For example, one type of electrical circuitry that may be utilized within integrated circuits is an amplifier circuit. It is well known by those of ordinary skill in the electrical arts that amplifier circuits may be designed and utilized for providing different functionality within different integrated circuitry.

For example, amplifier circuitry is utilized within optical communication links. One particular type of amplifier circuitry typically utilized within an optical communication link is a feedback amplifier circuit having a variable closed loop gain. One of the purposes of this type of amplifier is to provide an output voltage window based on the variation of an input current signal that can vary over a wide dynamic range. In order to handle a wide dynamic range of input current signals, the feedback amplifier circuit provides a variable amount of gain to them in order to avoid saturation with large input signals and also provides enough amplitude with smaller input signals.

FIG. 1 is a schematic diagram illustrating a conventional feedback amplifier circuit 100 having a variable closed loop gain. As mentioned above, one of the main purposes of feedback amplifier circuit 100 is to provide an output voltage based on the variation of an input current signal. Specifically, feedback amplifier circuit 100 converts an input current ($I_{in}$) 120 into an output voltage ($V_o$) 122. It is appreciated that as the amplitude of input current 120 fluctuates, feedback amplifier circuit 100 automatically adjusts its feedback network resistance in order to respond to a wide range of input signals.

More specifically, the feedback network of amplifier circuit 100 includes resistors 102, 104 and 106 along with series switches 108, 110 and 112. It should be appreciated that series switches 108–112 are typically implemented physically as Metal-Oxide Semiconductor Field Effect Transistors (MOSFETs). Additionally, a digital automatic gain control (AGC) circuit 114 is coupled to open and close series switches 108–112. Furthermore, digital automatic gain control circuit 114 is coupled to the output of a current amplifier 116 and resistor 106. As such, digital automatic gain control 114 compares the output voltage 122 of amplifier circuit 100 with some reference voltage and then adjusts the feedback network resistance in order to achieve an output voltage 122 that is within a certain window in response to variations of input signal 120. That is, digital automatic gain control 114 circuit is able to vary the feedback network resistance by opening and closing series switches 108–112 thereby changing the gain of amplifier circuit 100. For example, if digital automatic gain control 114 determines that the amplitude of the output voltage 122 is becoming too large, it may automatically open series switch 108 and switch 110 while closing series switch 112. In this manner, the feedback resistance of amplifier circuit 100 decreases thereby decreasing the amplitude (gain) of voltage output 122. Therefore, feedback amplifier circuit 100 is able to provide a relatively constant output voltage window 122 irrespective of the variation of input current signal 120.

It should be understood that there are some disadvantages associated with feedback amplifier circuit 100 having a variable closed loop gain. For example, one of the disadvantages is that when series switches 108–112 are physically implemented as MOSFETs, they add additional resistance and parasitics into the feedback network of amplifier circuit 100. Additionally, the resistance associated with each MOSFET varies depending on temperature, process, and gate to source voltage. As such, it is difficult to control the gain of amplifier circuit 100 when the resistance of a series switch (e.g., 112) becomes comparable with the required feedback resistance because of the MOSFET resistance variation with process, temperature, voltage, etc. Furthermore, during high frequency operation, the gain variation of amplifier circuit 100 and in turn the bandwidth variation are difficult to control. Therefore, feedback amplifier circuit 100 provides an output gain that during particular situations is difficult to control.

DISCLOSURE OF THE INVENTION

Accordingly, what is needed is a feedback amplifier circuit having a variable closed loop gain which is more controllable and accurate. What is needed is an amplifier in which the gain depends only on the actual feedback resistor which can be more easily controlled through the use of precision resistors. The present invention provides these advantages and others which will no doubt become obvious to those of ordinary skill in the art after having read the following detailed description of embodiments in accordance with the present invention.

Specifically, one embodiment of the present invention is an improved feedback amplifier circuit having a variable closed loop gain which avoids including switching elements in its feedback network. That is, the switching elements are not on the active feedback path (e.g., they are isolated from the active feedback path). In this manner, the gain of the amplifier circuit may be determined only by the feedback resistance which can be more easily controlled through the use of precision resistors. Additionally, by removing the switches from the feedback network, the parasitics associated with each switch may also be removed from the feedback path of the amplifier circuit. Accordingly, the bandwidth of the feedback amplifier circuit can be controlled more effectively. Specifically, the present embodiment avoids locating the switching functionality in the feedback network by changing the output stage of the feedback amplifier circuit. In other words, the switching functionality of the present embodiment is located within the output stage of the feedback amplifier circuit. Furthermore, it is appreciated that the present embodiment provides a way to isolate the unused feedback path of the feedback amplifier circuit which has a variable closed loop gain.

In yet another embodiment, the present invention includes a feedback amplifier circuit having a variable closed loop gain. The circuit includes an amplifier coupled to receive an alternating current (AC), a direct current (DC), and a reference voltage. Additionally, the circuit includes a plurality of resistors each having one end coupled to an input of the amplifier to create an active feedback path. Furthermore, the circuit includes a switching circuit coupled to an output of the amplifier and coupled to the plurality of resistors. Moreover, the circuit includes an automatic gain control circuit coupled to said output of the amplifier and coupled to the switching circuit. It is appreciated that the automatic gain control circuit is configured to cause the switching circuit to change the resistance of the active feedback path. Furthermore, the switching circuit is isolated from the active feedback path (e.g., the switching circuit is not included in the active feedback path).

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Embodiments of the present invention may operate as part of an integrated circuit (IC) semiconductor chip. It is appreciated that integrated circuit chips are found within a wide variety of modern electronic devices. For example, integrated circuit chips can be found within computers, satellites which orbit the earth relaying a multitude of communication signals, personal digital assistants (PDAs), pagers, global positioning system (GPS) devices, calculators, instrumentation, mobile phones, to name a few. It is understood that integrated circuit semiconductor chips are usually composed of many different types of electrical components and circuitry. For example, one type of electrical circuitry that may be utilized within integrated circuits is an amplifier circuit. Amplifier circuits may be designed and utilized for providing different functionality within integrated circuitry.

For example, amplifier circuitry is utilized within optical communication links. One particular type of amplifier circuitry typically utilized within an optical communication link is a feedback amplifier circuit having a variable closed loop gain. One of the purposes of this type of amplifier is to provide a relatively constant output voltage window irrespective of the variation of an input current signal. In order to handle a wide dynamic range of input current signals, the feedback amplifier circuit provides a variable amount of gain to them in order to avoid saturation with large input signals and also provides enough amplitude with smaller input signals. One embodiment in accordance with the present invention provides a feedback amplifier circuit with variable closed loop gain.

Amplifier Circuitry in Accordance with the Present Invention

Figure 1:
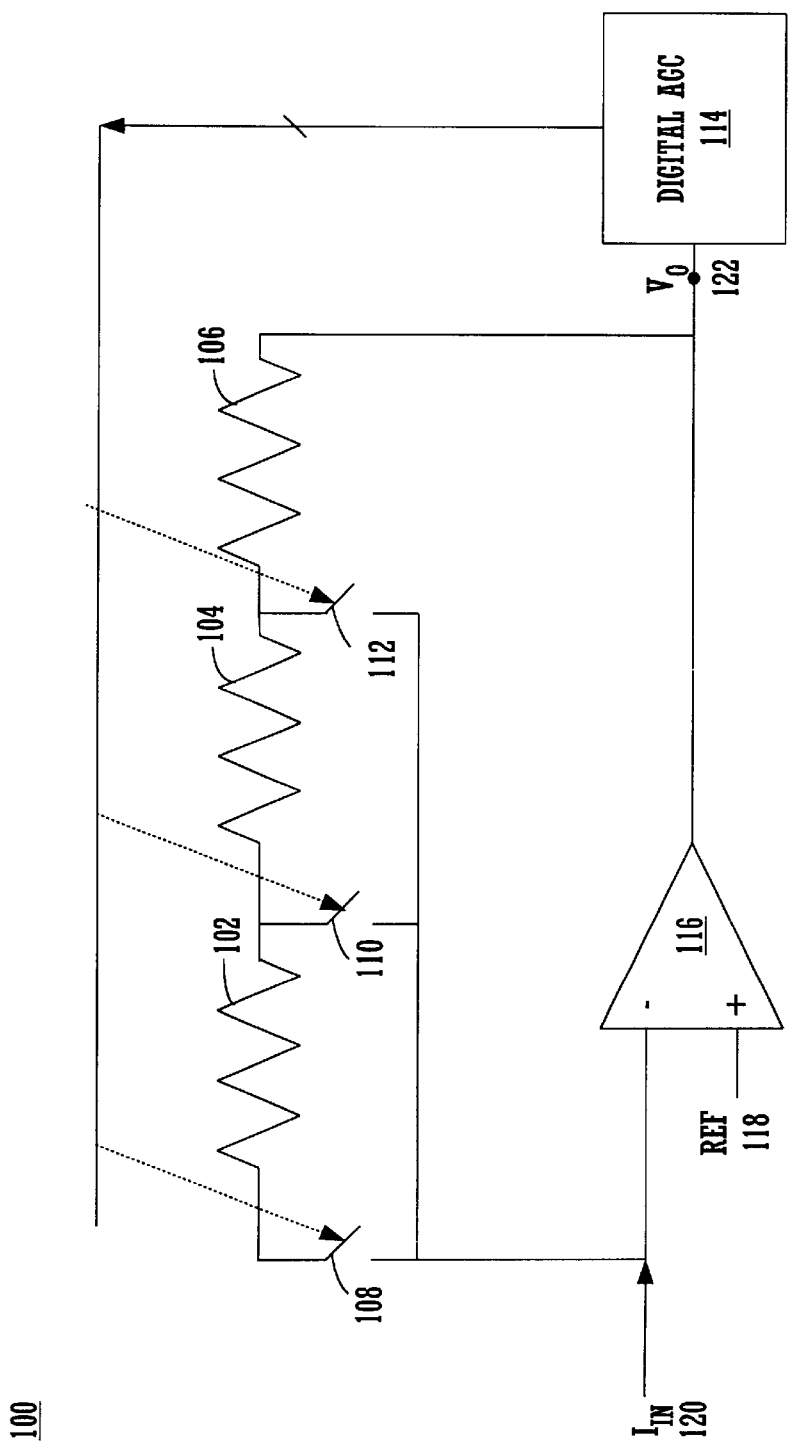
FIG. 1 is a schematic diagram illustrating a conventional feedback amplifier circuit having a variable closed loop gain.
Figure 2:
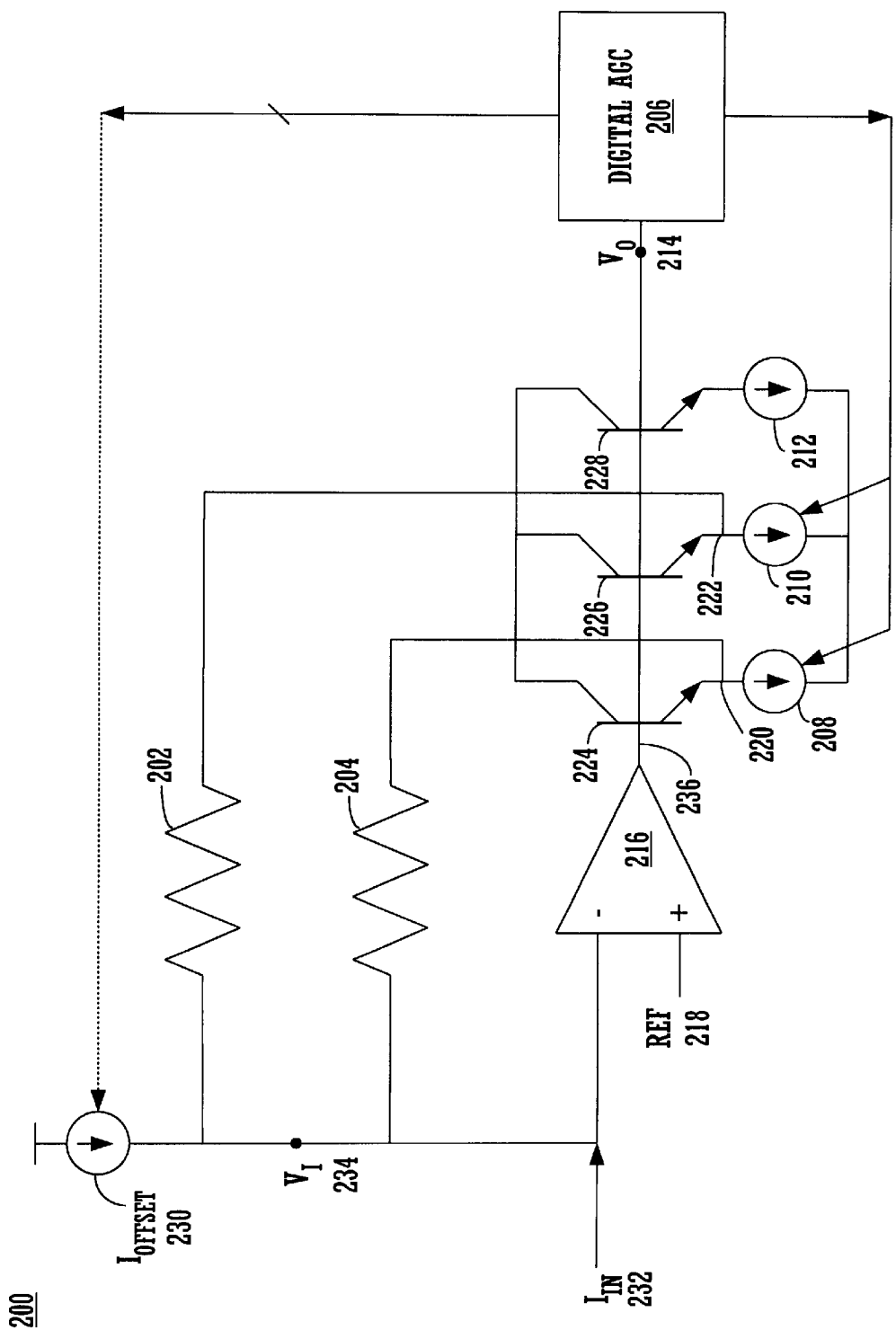
FIG. 2 is a schematic diagram illustrating a feedback amplifier circuit with a variable closed loop gain in accordance with one embodiment of the present invention.

FIG. 2 is a schematic diagram illustrating a feedback amplifier circuit 200 having a variable closed loop gain in accordance with one embodiment of the present invention. It is understood that feedback amplifier circuit 200 does not include switches in its feedback network. That is, the switching elements are not on the active feedback path (e.g., they are isolated from the active feedback path). In this fashion, the gain of feedback amplifier circuit 200 is determined only by the feedback resistor (e.g., 202 or 204) (and not influenced by the parasitic resistance of switch transistors) which can be more easily controlled through the use of precision resistors. Furthermore, by removing the switches from the feedback network, the parasitics associated with each switch may also be removed from the feedback path of amplifier circuit 200. Accordingly, the bandwidth of feedback amplifier circuit 200 can be controlled more effectively.

Specifically, within feedback amplifier circuit 200, a digital automatic gain control (AGC) circuit 206 is coupled to turn on and off current sources 208 and 210. Furthermore, digital automatic gain control circuit 206 is also coupled to receive the output voltage 214 of feedback amplifier circuit 200. As such, digital automatic gain control circuit 206 compares the output voltage 214 of feedback amplifier circuit 200 with some reference voltage (not shown) and then may adjust the feedback network resistance in order to achieve an output voltage within a certain window in response to variations of input current signal 232. That is, digital automatic gain control circuit 206 is able to vary the feedback network resistance of feedback amplifier circuit 200 by turning on and turning off current sources 208 and 210 thereby changing the gain of feedback amplifier circuit 200. For example, if digital automatic gain control circuit 206 determines that the amplitude of the output voltage 214 is becoming too large, it may automatically turn off a current source (e.g., 210) while turning on the other current source (e.g., 208). In this manner, the feedback resistance of amplifier circuit 200 decreases thereby decreasing the amplitude (gain) of voltage output 214. Therefore, feedback amplifier circuit 200 may provide a relatively constant output voltage window 214 irrespective of the variation of input current signal 232.

The present embodiment avoids locating the switching functionality in the feedback network of feedback amplifier circuit 200 of FIG. 2. That is, the switching functionality is not included in the active feedback path (e.g., it is isolated from the active feedback path). Specifically, the output stage of feedback amplifier circuit 200 includes the switching functionality which contains bipolar junction transistors 224, 226 and 228 coupled to current sources 208, 210 and 212, respectively. It is understood that each transistor (e.g., 224) has a corresponding current source (e.g., 208) which together constitute a unity gain buffer. As such, there may be three unity gain buffers coupled to digital automatic gain control circuit 206. Furthermore, feedback amplifier circuit 200 also includes an offset current source ($I_{offset}$) 230. The offset current source 230 helps in setting up the bias condition utilized for each gain setting of feedback amplifier circuit 200. Once the bias condition is met and a current source (e.g., 208) of a particular unity gain buffer is switched off by digital automatic gain control circuit 206, the corresponding feedback path (e.g., which includes resistor 204) gets automatically isolated. As such, the other current source (e.g., 210) is switched on by digital automatic gain control circuit 206 resulting in the other feedback path (e.g., which includes resistor 202) of feedback amplifier circuit 200 being the active path providing the gain. It is appreciated that the switching elements are not on the active feedback path (e.g., they are isolated from the active feedback path).

Within the present embodiment, a current of substantially 1 milliamperes (mA) may flow through the transistors 224–228 (collector to emitter) in order to keep them biased. This bias current may be provided by the current source 230, 208 and 210. It is understood that any amount of current may be utilized in order to bias transistors 224–228 in accordance with the present embodiment.

When digital automatic gain control circuit 206 of FIG. 2 turns off current source 210 and turns on current source 208, output voltage ($V_o$) 214 is expressed as:

$$V_o = V_i - (I_{offset} * R_{204}) - V_{be-224} - (I_{in} * R_{204}) + V_{be-228}$$

where $V_i$ is the voltage 234 which will be equal to reference voltage 218 in feedback condition, $I_{offset}$ is the offset current source value 230, $I_{in}$ is the input current 232, $R_{204}$ is the resistance value of resistor 204, $V_{be-224}$ is the voltage across the base and emitter of transistor 224, and $V_{be-228}$ is the voltage across the base and emitter of transistor 228. However, since the voltage across the base and emitter of transistor 224 ($V_{be-224}$) is almost equal to the voltage across the base and emitter of transistor 228 ($V_{be-228}$), output voltage ($V_o$) 214 may be expressed as:

$$V_o = V_i - (I_{offset} * R_{204}) - (I_{in} * R_{204})$$

In the same manner, when digital automatic gain control circuit 206 turns off current source 208 and turn on current source 210, output voltage ($V_o$) 214 is expressed as:

$$V_o = V_i - (I_{offset} * R_{202}) - (I_{in} * R_{202})$$

where $V_i$ is equal to the reference voltage in the operating condition, $I_{offset}$ is the offset current value 230, $I_{in}$ is the input current 232, and $R_{202}$ is the resistance value of resistor 202. In order to maintain the same direct current (DC) bias in both of the above situations, the value of ($I_{offset} * R_{202}$) should be equal to the value of ($I_{offset} * R_{204}$). It is appreciated that digital automatic gain control circuit 206 is coupled to control offset current source 230. As such, the value of the offset current 230 is also changed by digital automatic gain control circuit 206 when it switches the gain of feedback amplifier circuit 200 from one gain value (e.g., using resistor 202) to another gain value (e.g., using resistor 204). As such, the value of the offset current 230 is different for each gain value of feedback amplifier circuit 200. For example, within the present embodiment if resistor 202 substantially equals to 900 ohms (Ω), then offset current 230 may substantially equal 0.888 milliamperes (mA). Consequently, if resistor 204 substantially equals 150 ohms (Ω), then offset current 230 may substantially equal 5.3 mA.

It is understood that resistors 202 and 204 of the present embodiment are well suited to be implemented as any resistance value. However, within the present embodiment, resistor 204 may be substantially equal to 150 ohms (Ω) while resistor 202 may be substantially equal to 900 ohms (Ω). Furthermore, resistors 202 and 204 of the present embodiment may be well suited to be fabricated using a wide variety of materials. For example, resistors 202 and 204 may be fabricated using polysilicon. Additionally, it should be appreciated that the input current 232 may cover a wide amount of current values. For example, input current may be substantially equal to 5 microamperes up to 3 milliamperes.

It should be understood that when digital automatic gain control circuit 206 of FIG. 2 turns off current source 210 and turns on current source 208, the voltage at node 222 ($V_{222}$) and the voltage at the node 236 ($V_{236}$) are expressed as:

$$V_{222} = V_i \text{ and } V_{236} = V_{220} + V_{be-224}$$

Furthermore, the voltage at node 220 ($V_{220}$) is expressed as:

$$V_{220} = V_i - (I_{offset} * R_{204}) \text{(when } I_{in} = 0 \text{ mA)}$$

Therefore, the voltage at node 236 is expressed as:

$$V_{236} = V_i - (I_{offset} * R_{204}) + V_{be-224}$$

In other words, if $$(I_{offset} * R_{204}) \geq V_{be-224} \text{ and } V_{236} \leq V_i$$

then transistor 226 will turn off. Conversely, when digital automatic gain control circuit 206 turns off current source 208 and turns on current source 210, the voltage at node 220 ($V_{220}$) and the voltage at the node 236 ($V_{236}$) are expressed as:

$$V_{220} = V_i \text{ and } V_{236} = V_{222} + V_{be-226}$$

Furthermore, the voltage at node 222 ($V_{222}$) is expressed as:

$$V_{222} = V_i - (I_{offset} * R_{202})$$

Therefore, the voltage at node 236 is expressed as:

$$V_{236} = V_i - (I_{offset} * R_{202}) + V_{be-226}$$

In other words, if $$(I_{offset} * R_{202}) \geq V_{be-226} \text{ and } V_{236} \leq V_i$$

then transistor 224 will turn off.

It is appreciated that the alternating current (AC) trans-impedance of feedback amplifier circuit 200 is equal to the resistance of the resistor (e.g., 202 or 204) being actively utilized by feedback amplifier circuit 200. Furthermore, the present embodiment provides a scheme where the switching of the resistance values is achieved based on the operating point (bias condition) of the amplifier.

Still referring to FIG. 2, offset current source ($I_{offset}$) 230 is coupled to the negative input of current amplifier 216 and resistors 202 and 204. A reference voltage source 218 is coupled to the positive input of voltage amplifier 216. The output of voltage amplifier 216 is coupled to the base of transistors 224, 226, and 228. The collectors of transistors 224, 226, and 228 are coupled together. They may be connected to the positive power supply. Additionally, the emitters of transistors 224, 226, and 228 are coupled to one end of current sources 208, 210, and 212, respectively. The other end of current sources 208, 210, and 212 are coupled together. They may be connected to the negative power supply. It is appreciated that resistor 202 is coupled to the emitter of transistor 226 while resistor 204 is coupled to the emitter of transistor 224. The emitter of transistor 228 is coupled to the input of digital automatic gain control 206. The digital automatic gain control 206 is coupled to control current sources 208 and 210. Moreover, digital automatic gain control 206 is also coupled to control offset current source 230.

It should be understood that digital automatic gain control circuit 206 of the present embodiment is well suited to be implemented in a wide variety of ways. For example, digital automatic gain control circuit 206 may be implemented as an analog automatic gain control circuit. However, there are advantages associated with a digital automatic gain control circuit (e.g., 206). Compared to an analog automatic gain control circuit, a digital automatic gain control circuit (e.g., 206) is simpler, responds faster, and has less stability issues.

Referring still to FIG. 2, it is appreciated that the present embodiment may operate in a different manner than that described above. For example, digital automatic gain control circuit 206 of feedback amplifier circuit 200 may turn on both transistors 208 and 210. In this manner, the feedback resistance of feedback amplifier circuit 200 would be equal to the equivalent resistance of resistors 202 and 204 coupled in parallel.

Accordingly, the present invention provides a feedback amplifier circuit having a variable closed loop gain which is more controllable and accurate. It is appreciated that feedback amplifier circuit 200 of FIG. 2 may be utilized within trans-impedance amplifiers used in optical links.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A feedback amplifier circuit having a variable closed loop gain, said circuit comprising:
   an amplifier coupled to receive an alternating current (AC), a direct current (DC), and a reference voltage;
   a plurality of resistors each having one end coupled to an input of said amplifier to create an active feedback path, wherein said direct current is provided by a current source coupled to said plurality of resistors and said input of said amplifier;
   a switching circuit coupled to an output of said amplifier and coupled to said plurality of resistors; and
   an automatic gain control circuit coupled to said output of said amplifier and coupled to said switching circuit, said automatic gain control circuit configured to cause said switching circuit to change the resistance of said active feedback path and wherein said switching circuit is isolated from said active feedback path.

2. The feedback amplifier circuit as described in claim 1 wherein said switching circuit comprises a plurality of transistors.

3. The feedback amplifier circuit as described in claim 2 wherein said plurality of transistors comprise bipolar junction transistors.

4. The feedback amplifier circuit as described in claim 2 wherein said switching circuit further comprises a plurality of current sources coupled to said plurality of transistors.

5. The feedback amplifier circuit as described in claim 2 wherein said plurality of resistors coupled at the other ends to emitters of said plurality of transistors.

6. The feedback amplifier circuit as described in claim 1 wherein said switching circuit comprises a plurality of controllable current sources.

7. The feedback amplifier circuit as described in claim 1 wherein said automatic gain control circuit is coupled to said current source.

8. The feedback amplifier circuit as described in claim 1 wherein said current source provides a bias current to said switching circuit.

9. The feedback amplifier circuit as described in claim 1 wherein said automatic gain control circuit is a digital automatic gain control circuit.

10. A feedback amplifier circuit having a variable closed loop gain, said circuit comprising:
    an amplifier coupled to receive an alternating current (AC), a direct current (DC), and a reference voltage;
    a plurality of resistors coupled at one end to an input of said amplifier to create an active feedback path;
    a switching circuit coupled to an output of said amplifier and coupled to the other ends of said plurality of resistors, said switching circuit comprises a plurality of controllable current sources; and
    a digital automatic gain control circuit coupled to an output of said feedback amplifier circuit and coupled to said switching circuit, said digital automatic gain control circuit configured to cause said switching circuit to change the resistance of said active feedback path in response to said alternating current.

11. The feedback amplifier circuit as described in claim 10 wherein said switching circuit comprises a plurality of transistors.

12. The feedback amplifier circuit as described in claim 11 wherein said plurality of transistors comprise bipolar junction transistors.

13. The feedback amplifier circuit as described in claim 11 wherein said switching circuit further comprises a plurality of controllable current sources coupled to aid plurality of transistors.

14. The feedback amplifier circuit as described in claim 10 wherein said digital automatic gain control circuit is coupled to said plurality of controllable current sources.

15. The feedback amplifier circuit as described in claim 10 wherein said direct current is provided by a current source coupled to said plurality of resistors and said input of said amplifier.

16. The feedback amplifier circuit as described in claim 10 wherein said current source provides a bias current to said switching circuit.

17. A feedback amplifier circuit having a variable closed loop gain, said circuit comprising:
    a voltage amplifier coupled to receive an alternating current (AC), a direct current (DC), and a reference voltage;
    a plurality of resistors coupled at one end to an input of said voltage amplifier to create an active feedback path, wherein said direct current is provided by a current source coupled to said plurality of resistors and said input of said voltage amplifier;
    a switching circuit coupled to an output of said voltage amplifier and coupled to the other ends of said plurality of resistors, said switching circuit comprises a plurality of transistors; and
    an automatic gain control circuit coupled to an output of said feedback amplifier circuit and coupled to said switching circuit, said automatic gain control circuit configured to cause said switching circuit to change the resistance of said active feedback path and wherein said switching circuit is isolated from said active feedback path.

18. The feedback amplifier circuit as described in claim 17 wherein said plurality of transistors comprise bipolar junction transistors.

19. The feedback amplifier circuit as described in claim 17 wherein said switching circuit further comprises a plurality of controllable current sources coupled to said plurality of transistors.

20. The feedback amplifier circuit as described in claim 19 wherein said automatic gain control circuit is coupled to said plurality of controllable current sources.

21. The feedback amplifier circuit as described in claim 17 wherein said current source provides a bias current to said switching circuit.

* * * * *